United States Patent
Occhipinti et al.

[15] 3,638,167

[45] Jan. 25, 1972

[54] CONTROLLED INSERTION FORCE RECEPTACLE FOR FLAT CIRCUIT BEARING ELEMENTS

[72] Inventors: Carl Occhipinti, Melrose Park Post Office; Dennis R. Cakora, Lyons, both of Ill.

[73] Assignee: The Bunker-Ramo Corporation, Oak Brook, Ill.

[22] Filed: Apr. 13, 1970

[21] Appl. No.: 27,870

[52] U.S. Cl. ....................................339/74 R, 339/176 MP

[51] Int. Cl. .......................................................H01r 13/62

[58] Field of Search ......................................339/74, 75, 176

[56] References Cited

UNITED STATES PATENTS 3,526,869 9/1970 Conrad et al......................339/75 MP

FOREIGN PATENTS OR APPLICATIONS 1,234,816 2/1967 Germany...........................339/75 MP

OTHER PUBLICATIONS

IBM Technical Disclosure Bulletin, Gustafson, Vol. 10, No. 11, 4/1968, p. 1656

*Primary Examiner*—Joseph H. McGlynn
*Attorney*—Frederic M. Arbuckle

[57] ABSTRACT

A controlled insertion force receptacle for flat circuit bearing elements such as printed circuit boards. A first block of an insulating material having a slot in it which is adapted to receive the element. At least one contact finger is mounted in the first block and is positioned so as to make physical and electrical contact with a contact point on the element when the element is in the slot. A second block of an insulating material is mounted on the first block in a manner so as to be free to move relative to the first block in a direction perpendicular to the walls of the slot. The second block engages the contact fingers and causes the fingers to move to controlled positions in or out of the slot as the second block is moved relative to the first block. A member such as a camshaft is provided for moving the second block relative to the first block.

10 Claims, 3 Drawing Figures

INVENTOR.
CARL OCCHIPINTI
DENNIS R. CAKORA
BY

CONTROLLED INSERTION FORCE RECEPTACLE FOR FLAT CIRCUIT BEARING ELEMENTS

This invention relates to receptacles for flat circuit bearing elements, such as printed circuit boards or thick film and thin film substrates, and more particularly to a receptacle for these elements which exerts a controlled force on the element when it is being inserted into and withdrawn from the receptacle.

With the miniaturization of electronic circuits, many circuits are now either printed, deposited or otherwise formed on either or both surfaces of a board or similar substrate. In use, these boards are fitted into suitable receptacles which receptacles are then interconnected and connected to other circuit elements to form complex electronic devices. In order to permit electrical contact with the receptacle, a plurality of contact points are provided along at least one edge of the printed circuit board. These contact points generally are in the form of strips of conductive material to which circuitry on the board may be connected.

Standard receptacles used heretofore with printed circuit boards utilize contact members which are mechanically biased to engage the board and its terminal strips (contact points) with a predetermined force. This force, exerted over a circuit area, assures good electrical contact with the board when the board is in the receptacle. However, with increased miniaturization requiring smaller contact areas, the amount of pressure required to assure good contact has correspondingly increased. However, while this relatively high force is desirable when the board is in the receptacle, it can cause problems when the board is being inserted into or removed from the receptacle.

One problem stems from the fact that a substantial amount of circuitry appears on each printed circuit board thus requiring the use of a large number of contact points. It is not unusual for a circuit board to have from 50 to several hundred contact points. The combined force of this many contact points may make insertion and removal of a board difficult or even impossible without special equipment. Therefore, with standard receptacles, the contact pressure, and possibly the number of contact points on the board, must be restricted in order to permit easy insertion and removal of the board.

Another problem with existing receptacles is that the contacts rub under high pressure against the terminal strips of the printed circuit board during insertion and removal. Since the terminal strips of a typical board are only a few thousandth of an inch thick, this rubbing of the contacts against the terminal strips during insertion and removal of the boards tends to wear away the terminal strips and may well ruin a circuit board after several insertions and removals. The high friction between the boards and the receptacle contacts may also wear away precious metal plated on the contact surface or otherwise damage the contacts. This tends to reduce the useful life of the receptacle. Contact and terminal strip wear resulting from insertion and removal of boards with standard receptacles thus necessitates replacement of expensive elements and may well lead to difficult-to-detect failures in the electronic equipment utilizing the boards. Another related problem occurs when the element being utilized is a ceramic substrate such as is used with thin film and thick film circuits. These substrates are relatively fragile and may be chipped, cracked or broken in attempting to force them between the contacts of a standard receptacle.

It would therefore appear that a receptacle is required which exerts zero force on the circuit board contacts during board insertion and removal, and in many applications this is in fact a requirement. However, with time, a thin film tends to form on contact fingers and points which tends to reduce conductivity. This film can be penetrated or removed if there is a low controlled pressure wipe between the elements during board insertions and removals.

It is, therefore, a primary object of this invention to provide an improved receptacle for flat circuit bearing elements such as printed circuit boards and film substrates.

A more specific object of this invention is to provide a receptacle for thin circuit bearing elements which receptacle has contacts which apply a controlled force to the element during insertion and removal which force may, in some applications, be zero.

Some attempt has been made in the past to design receptacles for printed circuit boards and the like which exert zero force on the board during insertion and removal. One such receptacle is shown in copending application Ser. No. 846,496 entitled "Zero Insertion Force Receptacle for Flat Circuit Bearing Elements" filed July 31, 1969, on behalf of V. Palecek et al. and assigned to the assignee of the instant application. While this receptacle is excellent for many applications, there are at least three problems in its design, two of which are related, which limits its use in some applications. First, the cam shaft which is rotated to spread the contact fingers is in contact with the fingers and thus cannot be constructed of a conducting material. Since insulating materials of comparable price do not have the torque bearing capacity of conductive materials such as metals, the nonconducting shaft must be made thicker in order to be able to stand the required torque. The use of a thicker shaft increases the overall size of the receptacle and imposes a limitation or receptacle miniaturization efforts.

A second problem is that the camshaft is positioned below the point of contact between the receptacle contact fingers and the circuit board. Some distance must also be provided between the point at which the camshaft contacts the fingers and point at which the fingers emerge from the supporting block. The result is that the contact fingers are relatively long. This means that there is a relatively long electrical path through the fingers which increases circuit resistance and decreases circuit operating speed. This receptacle is thus not suitable for applications where a short circuit path is essential. The relatively short distance between the cantilever point and the point at which force is applied to the fingers in this prior art receptacle also substantially increases the amount of force which is required to move the fingers. From standard lever equations, it is apparent that the force required to move the fingers could be substantially reduced if the point at which force is applied could be moved further up on the fingers.

Other prior art devices for solving the zero insertion force problem have been relatively complex, bulky, expensive and heavy. These devices have also, in most instances, had the contact fingers normally biased away from the board during insertion and removal and have cammed them into contact with the board when the board is properly seated. Since the boards may vary slightly in thickness, or may be slightly warped, this mode of operation results in a greater force being applied to thicker boards and a lesser force being applied to thinner boards. Excessive force on a thicker board may damage the contact or the terminal strip coating, or, in the case of a ceramic board, the board itself. Too little force may result in poor electrical contact which can cause troublesome intermittent errors in the equipment utilizing the board.

A more specific object of this invention is therefore to provide an improved controlled or zero insertion and removal force receptacle for flat circuit bearing elements.

Another object of this invention is to provide a receptacle of the type indicated above which is relatively simple, compact, light and inexpensive.

A further object of this invention is to provide a receptacle of the type indicated above which permits the use of conductive material, such as metals, for torque bearing members.

A still further object of this invention is to provide a receptacle of the type indicated above which provides a short electrical path through the contact fingers.

Another object of this invention is to provide a receptacle of the type indicated above which minimizes the force necessary to move the contact fingers by providing a relatively large distance between the cantilever point of a contact finger and the point at which force is applied to the finger.

Another object of this invention is to provide a receptacle of the type indicated above which causes a uniform force to be applied to the circuit board terminal strips in spite of slight variations in board thickness or board warpage.

SUMMARY

In accordance with these objects this invention provides a receptacle for flat circuit bearing elements having contact points along at least one edge thereof. The receptacle includes a first block of an insulating material having a slot formed therein which slot is adapted to receive the edge of the element having a contact point. At least one contact means is mounted in the first block and is positioned so as to be adapted to make physical and electrical contact with a contact point of the element when the element is in the slot. A second block of an insulating material is mounted on the first block. The second block is mounted so as to be free to move relative to the first block in a direction perpendicular to the walls of the slot and includes means for engaging the contact means so as to cause the contact means to move to controlled positions relative to the slot as the second block is moved relative to the first block. A means is also provided for moving the second block relative to the first block. This moving means may include a camshaft which passes between the two blocks. In a preferred embodiment of the invention this camshaft is of a metallic material.

The foregoing and other objects, features and advantages of the invention will be apparent from the following more particular description of preferred embodiments of the invention, as illustrated in the accompanying drawing.

Figure 1:
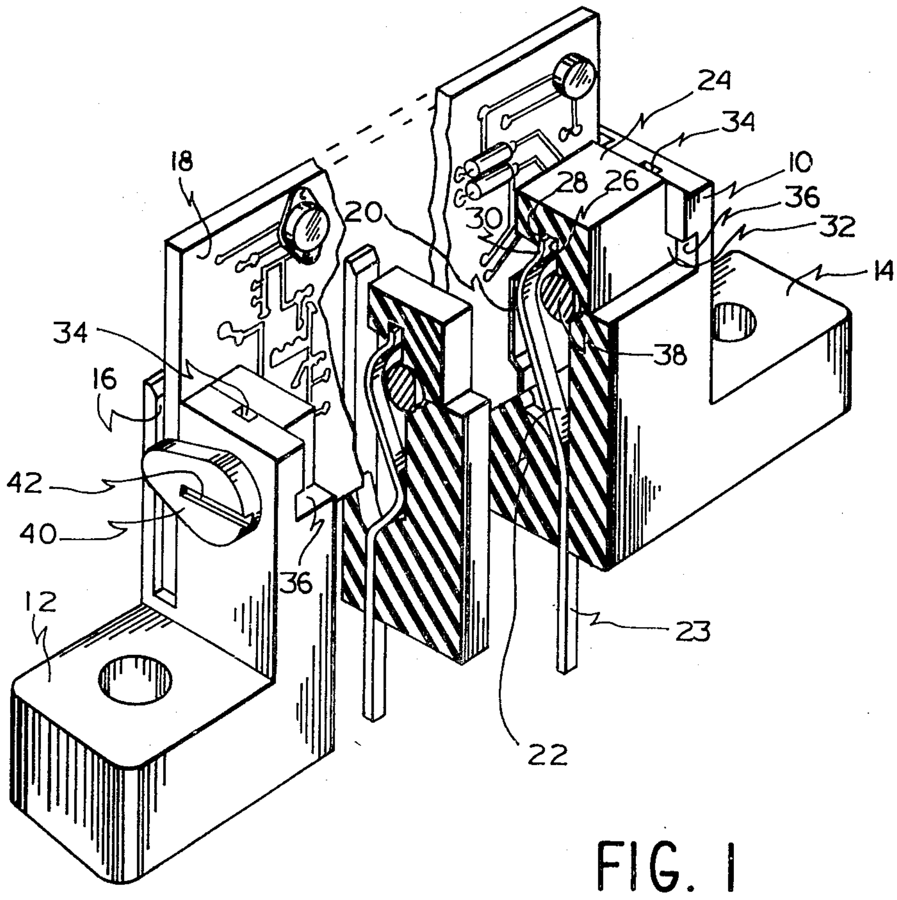
FIG. 1 is a cutaway perspective view of a preferred embodiment of the invention.

Referring now to FIG. 1, it is seen that the receptacle of this invention includes a block 10 of an insulating material. The block has two flanges 12 and 14 each with an opening through which a screw, rivet, or the like may be passed to secure the block to a frame or other supporting structure. The block also has a slot 16 molded in it which slot is adapted to receive a circuit board 18. Circuit board 18 has a plurality of contact points 20 formed thereon which points are adapted to make contact with corresponding contact fingers 22 mounted in block 10. The contact fingers are formed of a springlike material and may be plated with a precious metal such as gold to improve their conductivity. Each finger projects through block 10 and terminates in a tail 23 which may be wire wrapped, dip soldered directly to a multilayer board, or connected to in some other standard manner. The fingers are normally biased to project into slot 16 in a position which may best be seen in FIG. 2. When a circuit board is in the receptacle, as shown in FIG. 1, fingers 22 in their normally biased condition exert a substantial force against contact points 20 thus causing good physical and electrical contact to be made between the elements.

A second block 24 of an insulating material is mounted on block 10 and forms the upper portion of one wall of slot 16. Block 24 has a pocket 26 molded therein, the forward wall 28 (see FIGS. 2 and 3) of which is in contact with a projecting tip 30 of each finger 22. Block 24 has four flanges 32 (only one of which can be seen in FIG. 1), one at each of its corneis. During assembly, these flanges are lowered through slot 16 and slots 34 until they come to the level of slot 36. Block 24 is then moved forward to bring flanges 32 into slots 36 and a camshaft 38 is passed in front of block 24 to hold it in place. Shaft 38 is locked in the receptacle by securing head 40 to its forward end. Thus, block 24 is mounted in block 10 in a manner such that it is restrained against movement up or down by flanges 32 riding in slots 36, is restrained against moving too far to the left by camshaft 38, and is restrained against moving too far to the right by the spring action of tips 30 of fingers 22 against shoulder 28.

Figure 2:
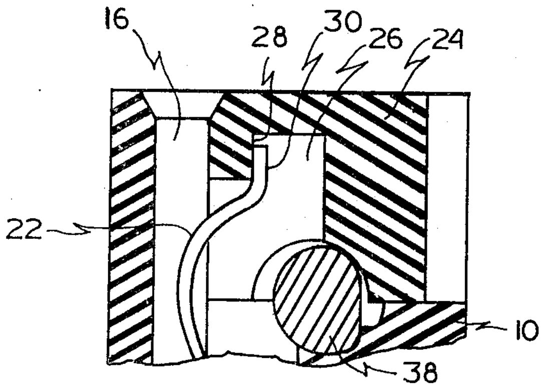
FIG. 2 is a partial sectional view of a portion of the receptacle showing the receptacle in a closed condition.
Figure 3:
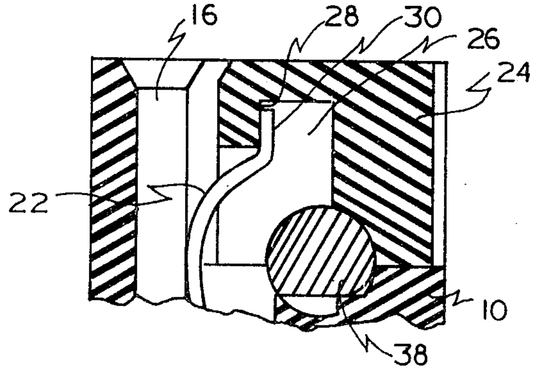
FIG. 3 is a sectional view of a portion of the receptacle showing a receptacle in an open condition.

In operation, the receptacle is normally in the condition shown in FIGS. 1 and 2 with the flat edge of camshaft 38 in a vertical position and fingers 20 projecting into slot 16. When the camshaft is in this position, a pointer projection of head 40 extends over the side of opening 16 preventing a board 18 from being inserted or removed from the receptacle through the side. This prevents damage to the board from an attempt to insert or remove it when the receptacle is in a closed condition. While it is possible that an attempt may be made to insert or remove the board from the top when the receptacle is in a closed condition, the likelihood of damage to the board from such an effort is significantly less and the high resistance force which would be encountered in such an effort would, in all likelihood, cause the effort to be terminated before any damage is done to the board. The pointer extension also serves to indicate the open or closed condition of the receptacle.

When it is desired to open the receptacle so as to permit a board to be inserted or removed, a screwdriver or similar tool is placed in slot 42 of head 40. The head, and camshaft 38 which is fixed thereto, is the rotated 90° in the clockwise direction to bring the shaft into the position shown in FIG. 3 with the flat edge of shaft 38 in a horizontal position. Since block 24 is restrained against upward motion by the action of flanges 32 in slots 36, the force exerted by camshaft 38 on block 24 as the shaft rotates causes block 24 to move to the right, as viewed in the Figures. The resulting force exerted by shoulder 28 against finger tips 30 pulls fingers 22 out of slot 16 and thus out of contact with circuit board 18. The criteria for a zero insertion force receptacle, namely lack of intimate contact during the engagement cycle, is therefore satisfied. It should be noted that the 90° rotations of head 40 causes its pointer extension to point upward thus permitting a circuit board to be passed through the side of slot 16. When a board is again positioned in slot 16, head 40 and shaft 38 may be rotated 90° counterclockwise to the position shown in FIGS. 1 and 2 to return the receptacle to its closed condition.

A zero insertion force receptacle has therefore been provided which is relatively simple, compact, light and inexpensive. Since only insulating blocks 10 and 24 are in contact with contact fingers 22, the torque bearing element, shaft 38, may be made of a metallic material and therefore may have a relatively small diameter. This permits the overall size of the receptacle, particularly its width, to be minimized. Further, there is nothing between the point at which a contact finger emerges from block 10 and the point at which it makes electrical contact with a contact point 20 of circuit board 18. Therefore, this distance may be reduced to an absolute minimum providing a short electrical path through the contact finger which may be 300 mills or less. However since force is applied to the fingers at their upper tip, there is a relatively large distance between the cantilever point of the finger and the point at which force is applied thus significantly reducing the amount of force requiring to draw the fingers back. The fingers are normally biased into contact with the board and the force applied to a board is thus fairly uniform regardless of slight variations in board thickness or board warpage.

The elements in the Figures have been designed so as to completely remove contact fingers 22 from slot 16 when the receptacle is in an open condition, thus providing a zero insertion force receptacle. However, if a slight wiping action is desired during insertion and removal, the elements could be dimensioned so as to leave fingers 22 projecting by a small controlled amount into the slot.

It is also apparent that, while a right-hand model of the connector has been shown in the Figures, a left-hand model, which is a mirror image of that shown, could just as easily be constructed. A right- and a left-hand model could also be mounted side by side with a single slot to accommodate a double-sided board. Further, while for the preferred embodiment of invention shown in the Figures, fingers 22 are normally biased into slot 16 and are pulled out of the slot under the action of block 24 and camshaft 38, many of the advantages of this invention could be achieved if the receptacle were modified in a manner which would be obvious to one skilled in the art to have the fingers biased out of slot 16 and driven into the slot by the action of the block and the camshaft. The specific shape of the various elements such as the blocks, the fingers, and the camshaft could also be modified while still remaining within the scope of the invention. Further, while the receptacle shown in the Figure is adapted for insertion of a board from the side, the features of this invention are equally applicable with receptacles designed for insertion from the top. Thus, while the invention is being particularly shown and described with reference to a preferred embodiment thereof, the foregoing and other changes in form and details may be made therein by those skilled in the art without departing from the spirit and scope of the invention.

What is claimed is:

1. A receptacle for a flat circuit bearing element having contact points along at least one edge thereof comprising:
   - a first block of an insulating material having a slot therein which is adapted to receive the edge of said element having said contact points;
   - at least one contact means mounted in said first block and positioned to be capable of making physical and electrical contact with a contact point of said element when said element is in said slot;
   - a second block of an insulating material mounted on said first block and movable relative to said first block in a direction perpendicular to the walls of said slot, said second block including means engageable with said contact means at a point above the point at which said contact means contacts said element, so as to cause said contact means to move to controlled positions relative to said slot as said second block is moved relative to said first block;
   - and means for moving said second block relative to said first block.

2. A receptacle of the type described in claim 1 wherein said contact means is normally biased to a position in said slot in which it makes physical and electrical contact with a contact point of said element; and wherein said moving means is operative to move said second block to a position in which it substantially removes said contact means from said slot.

3. A receptacle of the type described in claim 1 wherein said second block has a pocket which is adapted to engage the upper tip of said contact means.

4. A receptacle of the type described in claim 1 wherein the controlled positions to which said contact means may be moved include a first position in which said contact means is in said slot and adapted to make contact with a contact point of said element, and a second position in which said contact means is substantially out of said slot and not adapted to make contact with said contact point.

5. A receptacle of the type described in claim 1 wherein said moving means includes a camshaft which passes between said first and second blocks.

6. A receptacle of the type described in claim 5 wherein there are a plurality of said contact means, each adapted to make physical and electrical contact with a different contact point of said element; and wherein said second block and said moving means including said single camshaft are operative to control the position of all of said contact means.

7. A receptacle of the type described in claim 5 wherein said second body is movable, by rotation of said camshaft through a predetermined angle, from a first position in which said contact means is free to enter said slot and is adapted to make contact with a contact point of said element, to a second position in which said contact means is moved by said second body substantially out of said slot to an extent such that it is not capable of making contact with said contact point.

8. A receptacle of the type described in claim 7 wherein said predetermined angle is 90°.

9. A receptacle of the type described in claim 7 including means operative when said block is in said first position for preventing an element from being inserted in said slot.

10. A receptacle of the type described in claim 9 wherein said element insertion prevention means is adapted to rotate from a blocking to a nonblocking position as said camshaft is rotated to move said second block from said first to said second position.

* * * * *